United States Patent
Yamakawa et al.

(10) Patent No.: US 9,551,467 B2
(45) Date of Patent: *Jan. 24, 2017

(54) WHITE LIGHT SOURCE AND WHITE LIGHT SOURCE SYSTEM INCLUDING THE SAME

(71) Applicants: KABUSHIKI KAISHA TOSHIBA, Tokyo (JP); TOSHIBA MATERIALS CO., LTD., Yokohama-shi, Kanagawa-ken (JP)

(72) Inventors: Masahiko Yamakawa, Yokohama (JP); Yasuhiro Shirakawa, Yokohama (JP)

(73) Assignees: KABUSHIKI KAISHA TOSHIBA, Tokyo (JP); TOSHIBA MATERIALS CO., LTD., Yokohama-Shi (JP)

( * ) Notice: Subject to any disclaimer, the term of this patent is extended or adjusted under 35 U.S.C. 154(b) by 262 days.

This patent is subject to a terminal disclaimer.

(21) Appl. No.: 14/353,579

(22) PCT Filed: Oct. 23, 2012

(86) PCT No.: PCT/JP2012/077296
§ 371 (c)(1),
(2) Date: Apr. 23, 2014

(87) PCT Pub. No.: WO2013/061943
PCT Pub. Date: May 2, 2013

(65) Prior Publication Data
US 2014/0293577 A1   Oct. 2, 2014

(30) Foreign Application Priority Data

Oct. 24, 2011   (JP) ................................. 2011-233420
Oct. 24, 2011   (JP) ................................. 2011-233422

(51) Int. Cl.
*F21K 99/00* (2016.01)
*F21V 9/16* (2006.01)
(Continued)

(52) U.S. Cl.
CPC ............. *F21K 9/56* (2013.01); *C09K 11/7734* (2013.01); *F21K 9/60* (2016.08); *F21V 9/16* (2013.01);
(Continued)

(58) Field of Classification Search
CPC ................ F21K 9/56; F21K 9/50; F21K 9/16; F21K 9/60; H01L 33/504; C09K 11/7734; F21V 9/16; Y02B 20/181
(Continued)

(56) References Cited

U.S. PATENT DOCUMENTS 6,417,019 B1   7/2002   Mueller et al.
7,611,641 B2   11/2009   Schmidt et al.
(Continued)

FOREIGN PATENT DOCUMENTS

JP   10-242513 A   9/1998
JP   2003-034791 A   2/2003
(Continued)

OTHER PUBLICATIONS

Notice of Allowance issued in co-pending U.S. Appl. No. 14/353,574 mailed Mar. 17, 2015. (7 pgs.).
(Continued)

*Primary Examiner* — Anh Mai
*Assistant Examiner* — Arman B Fallahkhair
(74) *Attorney, Agent, or Firm* — Foley & Lardner LLP

(57) ABSTRACT

The present invention provides a white light source comprising: a blue light emitting diode (blue LED) having a light emission peak wavelength in a range of 421 to 490 nm; and a phosphor layer including phosphor and resin, wherein the
(Continued)

white light source satisfies a relational equation of $-0.2 \leq [(P(\lambda) \times V(\lambda))/(P(\lambda max1) \times V(\lambda max1)) - (B\lambda) \times V(\lambda))/(B(\lambda max2) \times V(\lambda max2))] \leq +0.2$, assuming that: a light emission spectrum of the white light source is $P(\lambda)$; a light emission spectrum of black-body radiation having a same color temperature as that of the white light source is $B(\lambda)$; a spectrum of a spectral luminous efficiency is $V(\lambda)$; a wavelength at which $P(\lambda) \times V(\lambda)$ becomes largest is $\lambda max1$; and a wavelength at which $B(\lambda) \times V(\lambda)$ becomes largest is $\lambda max2$, and wherein an amount of chromaticity change on CIE chromaticity diagram from a time of initial lighting up of the white light source to a time after the white light source is continuously lighted up for 6000 hours is less than 0.010. According to the above white light source, there can be provided a white light source capable of reproducing the same light emission spectrum as that of natural light.

11 Claims, 11 Drawing Sheets

(51) Int. Cl.
    *H01L 33/50*     (2010.01)
    *C09K 11/77*     (2006.01)

(52) U.S. Cl.
    CPC .......... *H01L 33/504* (2013.01); *F21Y 2113/13* (2016.08); *F21Y 2115/10* (2016.08); *Y02B 20/181* (2013.01)

(58) Field of Classification Search
    USPC ............ 362/231, 230, 84, 249.02, 235; 313/501–506, 485–487, 498; 257/89
    See application file for complete search history.

(56) References Cited

U.S. PATENT DOCUMENTS

| | | | |
|---|---|---|---|
| 7,700,002 B2 | 4/2010 | Schmidt et al. | |
| 7,961,762 B2* | 6/2011 | Ishii | C09K 11/7734 372/22 |
| 8,018,135 B2* | 9/2011 | Van De Ven | H05B 33/086 313/498 |
| 8,089,207 B2* | 1/2012 | Ramer | F21K 9/135 313/498 |
| 8,403,531 B2 | 3/2013 | Negley et al. | |
| 8,415,692 B2* | 4/2013 | Le Toquin | H01L 33/44 257/98 |
| 8,581,488 B2 | 11/2013 | Sakuta et al. | |
| 8,684,559 B2* | 4/2014 | Van De Ven | F21K 9/137 257/98 |
| 8,710,532 B2 | 4/2014 | Yamakawa et al. | |
| 2002/0158565 A1* | 10/2002 | Setlur | C09K 11/664 313/486 |
| 2004/0245532 A1 | 12/2004 | Maeda et al. | |
| 2006/0226759 A1* | 10/2006 | Masuda | C09K 11/0883 313/486 |
| 2007/0259206 A1 | 11/2007 | Oshio | |
| 2010/0063566 A1 | 3/2010 | Uchiumi et al. | |
| 2010/0245227 A1* | 9/2010 | Chen | G09G 3/3426 345/102 |
| 2011/0221330 A1 | 9/2011 | Negley et al. | |
| 2012/0112626 A1 | 5/2012 | Sakuta et al. | |
| 2014/0042896 A1 | 2/2014 | Sakuta et al. | |

FOREIGN PATENT DOCUMENTS

| | | |
|---|---|---|
| JP | 2007-250817 A | 9/2007 |
| JP | 2010-268004 A | 11/2010 |
| WO | WO 2008/069101 A1 | 6/2008 |
| WO | WO 2008/153120 A1 | 12/2008 |
| WO | WO 2011/024818 A1 | 3/2011 |
| WO | WO-2011/115032 A1 | 9/2011 |

OTHER PUBLICATIONS

Office Action mailed Dec. 5, 2014 in co-pending U.S. Appl. No. 14/353,574 (5 pgs.).

U.S. Appl. No. 14/353,574, filed Apr. 23, 2014, Kabushiki Kaisha Toshiba et al.

Translation of International Preliminary Report Patentability corresponding to PCT/JP2012/077296.

* cited by examiner

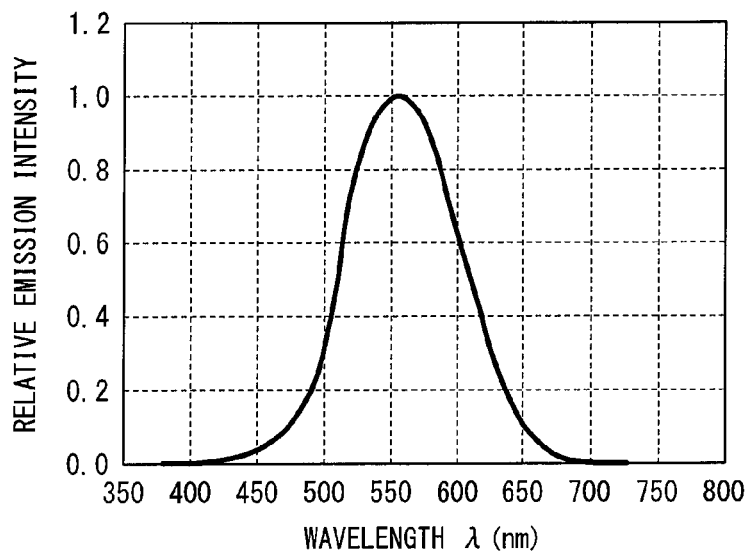
FIG. 1
$$B(\lambda) = \frac{2hc^2}{\lambda^5} \frac{1}{e^{hc/\lambda kT}-1}$$
FIG. 2
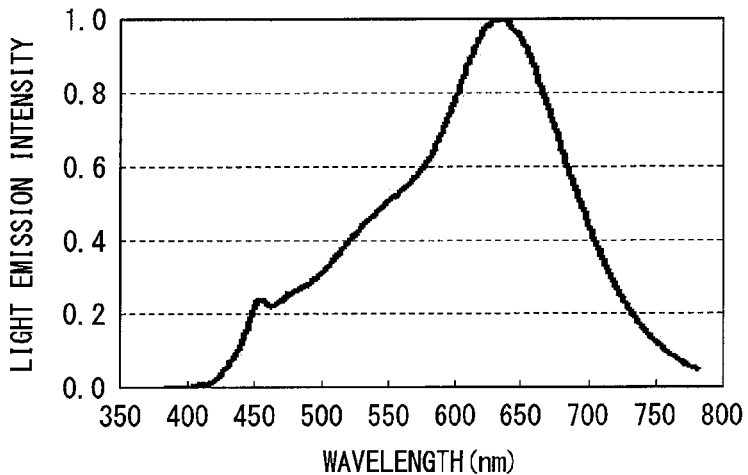
FIG. 3

WHITE LIGHT SOURCE AND WHITE LIGHT SOURCE SYSTEM INCLUDING THE SAME

TECHNICAL FIELD

The present invention relates to a white light source and a white light source system including the white light source. More particularly, the present invention relates to a white light source having a light emission spectrum close to the light emission spectrum of natural light, and relates to a white light source system including the white light source.

BACKGROUND ART

In recent years, white light sources including light emitting diodes (LEDs) have attracted attention in terms of energy saving measures and a reduction in the amount of emitted carbon dioxide. As compared with conventional incandescent bulbs including tungsten filaments, LEDs have longer service life, and enable energy saving. As disclosed in Japanese Patent Laid-Open (Unexamined Publication) No. 10-242513 (Patent Document 1), in conventional white LEDs, YAG phosphors are excited using blue LEDs each having a light emission peak wavelength in a range of 400 to 530 nm, and the blue light emitted from the LEDs and the yellow light emitted from the YAG phosphors are mixed with each other, whereby white light is achieved and realized.

White light sources including LEDs have been widely used as backlights of traffic signal lights and liquid crystal displays (LCD) as well as general lighting equipment (illuminating equipment) such as room lights. In the light emission spectra of conventional white light sources including blue LEDs, the peak height of the blue light emitted from the blue LEDs is as large as at least 1.5 times the peak height of the yellow light emitted from phosphors, and hence influences of the blue light tend to be strong.

Under the circumstances, with the popularization of the white light sources including LEDs, adverse effects of the white light sources on human bodies start to be worried about. As described above, the light emission peaks of blue LEDs are strong in conventional white LEDs. Such white light having a strong blue emission peak is significantly different from that of natural light. Here, the natural light refers to sunlight.

According to the pamphlet of International Publication No. WO 2008/069101 (Patent Document 2), which has been achieved in consideration of the influences of such white light sources on human bodies, LEDs and phosphors having different light emission peaks are combined, and four types of light emission peak are thus mixed, whereby a white light with a small deviation from the spectral luminous efficiency is provided.

Here, the sensitivity of a human eye to light is referred to as luminosity function, and the spectral luminous efficiency is defined as standard spectral luminosity function $V(\lambda)$ by International Commission on Illumination (CIE). Accordingly, luminosity function $V(\lambda)$ are the same in meaning. FIG. 1 the spectral luminous efficiency and the standard spectral shows the spectral luminous efficiency $V(\lambda)$ defined by CIE. That is, FIG. 1 shows that humans recognize light having a wavelength of about 555 nm at the highest sensitivity.

On the other hand, Patent Document 2 has an object to control light having a wavelength in a range of 420 to 490 nm, in consideration of influences of blue light on human bodies. Such a method can be expected to produce an effect of normalizing the secretion of melatonin that is one of hormones concerning adjustment by a biological clock in the nighttime.

In this regard, humans have a circadian rhythm (24-hour rhythm) controlled by an internal body clock. Humans are supposed to basically live under natural light, but there are a variety of lifestyles, such as long-time indoor work and a day-night reversal style, in modern society. If a life without exposure to natural light is continued for a long period, the circadian rhythm is disturbed, and adverse effects on human bodies are worried about.

PRIOR ART DOCUMENTS

Patent Document

Patent Document 1: Japanese Patent Laid-Open No. 10 (1998)-242513
Patent Document 2: the pamphlet of International Publication No. WO 2008/069101

DISCLOSURE OF THE INVENTION

Problems to be Solved by the Invention

Current white light sources including LEDs, that is, white light sources including blue LEDs have light emission spectra significantly different from that of natural light. A long-time life under irradiation by such white light sources may adversely affect a human circadian rhythm.

The present invention, which has been made in order to deal with such a problem, has an object to provide a white light source and a white light source system having a light emission spectrum close to the light emission spectrum of natural light.

Means for Solving the Problems

In order to achieve the above-mentioned object, a white light source according to a first invention comprises: a blue light emitting diode (blue LED) having a light emission peak wavelength in a range of 421 to 490 nm; and a phosphor layer including phosphor and resin, wherein the white light source satisfies a relational equation of $-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2$, assuming that: a light emission spectrum of the white light source is $P(\lambda)$; a light emission spectrum of black-body radiation having a same color temperature as that of the white light source is $B(\lambda)$; a spectrum of a spectral luminous efficiency is $V(\lambda)$; a wavelength at which $P(\lambda) \times V(\lambda)$ becomes largest is $\lambda max1$; and a wavelength at which $B(\lambda) \times V(\lambda)$ becomes largest is $\lambda max2$, and wherein an amount of chromaticity change on CIE chromaticity diagram from a time of initial lighting up of the white light source to a time after the white light source is continuously lighted up for 6000 hours is less than 0.010.

Further, a white light source according to a second invention comprises: a blue light emitting diode (blue LED) having a light emission peak wavelength in a range of 421 to 490 nm; and a phosphor layer including phosphor and resin, wherein the white light source satisfies a relational equation of $-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2$, assuming that: a light emission spectrum of the white light source is $P(\lambda)$; a light emission spectrum of black-body radiation having a same color temperature as that of the white light source is $B(\lambda)$; a spectrum of a spectral luminous efficiency is $V(\lambda)$; a wavelength at which $P(\lambda) \times V(\lambda)$ becomes largest is $\lambda max1$; and a wavelength at which $B(\lambda) \times V(\lambda)$ becomes largest is $\lambda max2$, and wherein a mass ratio of the phosphor contained in the phosphor layer is 5 mass % or more and 50 mass % or less.

It is more preferable that each of the above-mentioned white light sources satisfies a relational equation of $-0.1 \leq [(P(\lambda) \times V(\lambda))/(P(\lambda max1) \times V(\lambda max1))-(B(\lambda) \times V(\lambda))/(B(\lambda max2) \times V(\lambda max2))] \leq +0.1$. Further, it is preferable that the color temperature of the white light source is set to be 2,500 to 5,400 K.

Further, it is preferable that the above-mentioned phosphor layer includes two or more types (more preferably three or more types) of phosphor each having different peak wavelengths. Further, it is still more preferable that the above-mentioned three or more types of phosphor each having different peak wavelengths are used in a combination so as to cause a mutual absorption in which one phosphor is excited by absorbing a light emitted from another phosphor.

Further, it is still more preferable that the phosphor layer has a thickness of 0.01 to 3 mm. Furthermore, it is still more preferable that the phosphor has an average particle diameter of 1 to 80 μm.

Further, it is more preferable that a space is formed to a portion between the phosphor layer and the light emitting diode. Further, it is also preferable that the phosphor layer is provided on the light emitting diode. Further, it is also preferable that the phosphor layer is provided on the light emitting diode through a transparent resin layer.

Further, a white light source system according to the present invention is configured by comprising a plurality of the above-mentioned white light sources according to the present invention.

Advantages of the Invention

A white light source according to the present invention can reproduce the same light emission spectrum as that of natural light. Accordingly, even if a human body is exposed to white light emitted from the white light source for a long time, adverse effects on the human body can be made equivalent to those of natural light.

Further, in a case where three or more types of phosphor each having different peak wavelengths are used, there can be provided a white light source capable of suppressing a chromaticity change even after the white light source is used for a long period of time, thus having a high reliability.

Further, since the mass ratio of the phosphor contained in the phosphor layer is controlled, there can be provided a white light source capable of effectively suppressing a brightness degradation even after the white light source is used for a long period of time, thus having a high reliability.

BRIEF DESCRIPTION OF THE DRAWINGS

FIG. 1 is a graph showing a spectral luminous efficiency $V(\lambda)$.

FIG. 2 is a mathematical expression (formula) for obtaining a light emission spectrum $B(\lambda)$ of black-body radiation.

FIG. 3 is a graph showing the light emission spectrum of a white light source in Example 1.

BEST MODE FOR CARRYING OUT THE INVENTION

A white light source according to an embodiment of the present invention comprises a blue light emitting diode (blue LED) having a light emission peak wavelength in a range of 421 to 490 nm, and satisfies a relational equation of $-0.2 \leq [(P(\lambda) \times V(\lambda))/(P(\lambda max1) \times V(\lambda max1))-(B(\lambda) \times V(\lambda))/(B(\lambda max2) \times V(\lambda max2))] \leq +0.2$, assuming that: the light emission spectrum of the white light source is $P(\lambda)$; the light emission spectrum of black-body radiation having the same color temperature as that of the white light source is $B(\lambda)$; the spectrum of a spectral luminous efficiency is $V(\lambda)$; the wavelength at which $P(\lambda) \times V(\lambda)$ becomes largest is $\lambda max1$; and the wavelength at which $B(\lambda) \times V(\lambda)$ becomes largest is $\lambda max2$. Here, $\lambda$ denotes a wavelength of 380 to 780 nm in a visible light region.

The white light source satisfying the above-mentioned relational equation is configured according to the following procedures. First, the light emission spectrum $P(\lambda)$ of the white light source is measured. The light emission spectrum is measured according to total luminous flux measurement using an integrating sphere in conformity with JIS-C-8152. The color temperature is calculated from the light emission spectrum. Note that the unit of the color temperature is kelvin (K).

Next, the light emission spectrum $B(\lambda)$ of the black-body radiation having the same color temperature as that of the white light source is obtained. The light emission spectrum $B(\lambda)$ is obtained according to Planck's distribution. The Planck's distribution can be obtained according to a mathematical expression shown in FIG. 2. In FIG. 2, h denotes a Planck's constant, c denotes the speed of light, $\lambda$ denotes a wavelength, e denotes a base of natural logarithm, k denotes a Boltzmann's constant, and T denotes a color temperature. Because h, c, e, and k are constants, if the color temperature T is determined, the light emission spectrum of the black-body radiation can be obtained in accordance with the wavelength $\lambda$.

In the present invention, the black-body radiation indicates the light emission spectrum of natural light (sunlight). The natural light has different color temperatures, for example, in the daytime, in the morning, at sunrise, and in the evening. More specifically, the color temperature of the natural light in the daytime is about 5100 K, the color temperature of the natural light in the morning is about 4,200 K, the color temperature of the natural light at sunrise is about 2,700 K, and the color temperature of the natural light in the evening is about 2,800 K. Note that 7 a.m. is assumed as the morning.

Figure 5:
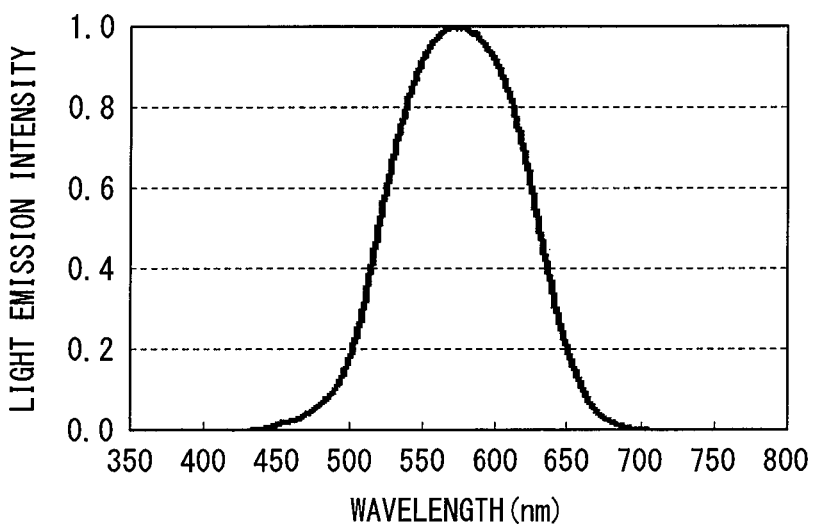
FIG. 5 is a graph showing $(P(\lambda) \times V(\lambda))/(P(\lambda max1) \times V(\lambda max1))$ in Example 1.

FIG. 3 shows a light emission spectrum $P(\lambda)$ in Example 1 to be described later. FIG. 5 shows $(P(\lambda) \times V(\lambda))/(P(\lambda max1) \times V(\lambda max1))$ in Example 1. Further, FIG. 6 shows $(B(\lambda) \times V(\lambda))/(B(\lambda max2) \times V(\lambda max2))$ in Example 1 (color temperature of 2700 K).

Figure 6:
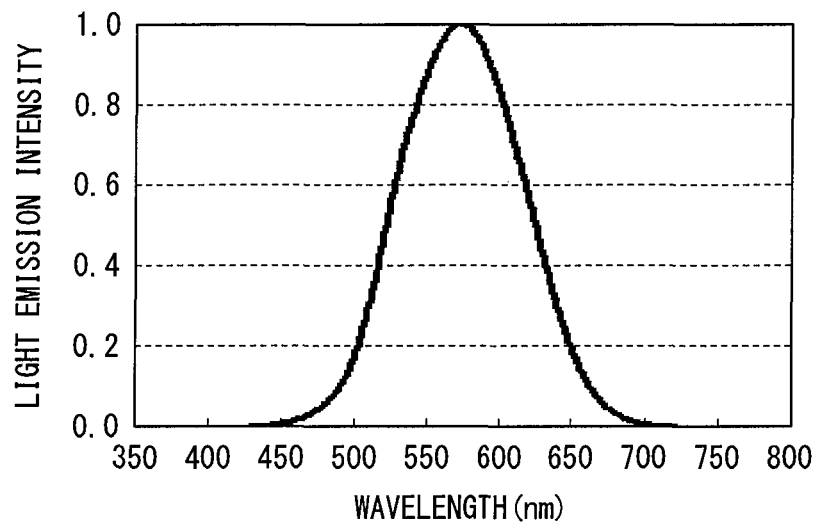
FIG. 6 is a graph showing $(B(\lambda) \times V(\lambda))/(B(\lambda max2) \times V(\lambda max2))$ in Example 1 (color temperature of 2700K).

The spectral luminous efficiency shown in FIG. 1 is used for $V(\lambda)$ for obtaining FIG. 5 and FIG. 6.

FIG. 5 is a graph obtained by: multiplying, for each wavelength, values of the light emission spectrum $P(\lambda)$ in Example 1 shown in FIG. 3 by values of the spectral luminous efficiency $V(\lambda)$; dividing the resultant products by $(P(\lambda max1) \times V(\lambda max1))$; and plotting the resultant quotients. In FIG. 5, the wavelength at which $(P(\lambda) \times V(\lambda))$ becomes largest is $\lambda max1 = 556$ nm.

Figure 4:
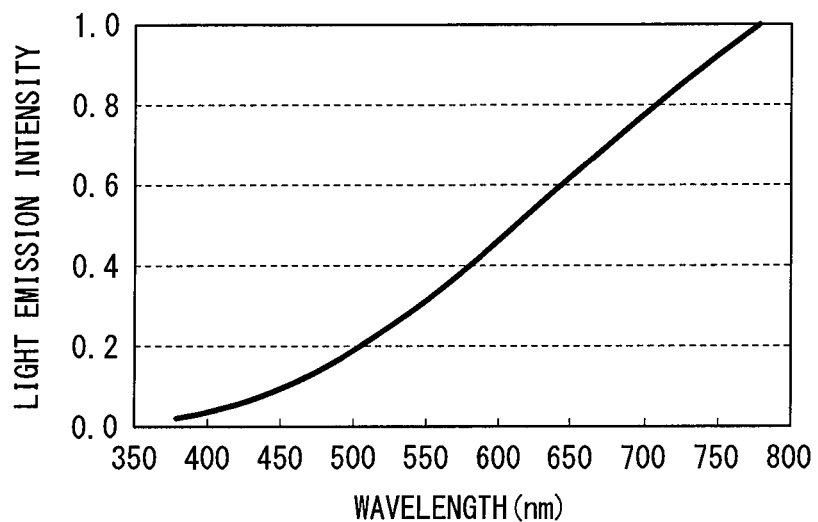
FIG. 4 is a graph showing a light emission spectrum $B(\lambda)$ of black-body radiation in Example 1 (color temperature of 2700K).

FIG. 6 is a graph obtained by: multiplying, for each wavelength, values of the light emission spectrum $B(\lambda)$ in FIG. 4 by values of the spectral luminous efficiency $V(\lambda)$; dividing the resultant products by $(B(\lambda max2) \times V(\lambda max2))$; and plotting the resultant quotients. In FIG. 6, the wavelength at which $(B(\lambda) \times V(\lambda))$ becomes largest is $\lambda max2 = 556$ nm.

$(P(\lambda) \times V(\lambda))$ indicates the intensity of the light emission spectrum of the white light source in a spectral luminous efficiency $V(\lambda)$ region. $(P(\lambda) \times V(\lambda))$ is divided by $(P(\lambda max1) \times V(\lambda max1))$ that is the maximum value, whereby the upper limit thereof can be 1.0 as shown in FIG. 5.

Further, $(B(\lambda) \times V(\lambda))$ indicates the intensity of the light emission spectrum of the black-body radiation in the spectral luminous efficiency $V(\lambda)$ region. $(B(\lambda) \times V(\lambda))$ is divided by $(B(\lambda max2) \times V(\lambda max2))$ that is the maximum value, whereby the upper limit thereof can be 1.0 as shown in FIG. 6.

Next, a difference $A(\lambda) = [(P(\lambda) \times V(\lambda))/(P(\lambda max1) \times V(\lambda max1)) - (B(\lambda) \times V(\lambda))/(B(\lambda max2) \times V(\lambda max2))]$ is obtained. The white light source according to the present embodiment satisfies a relation: $-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2$. If the difference $A(\lambda)$ satisfies the relation: $-0.2 \leq A(\lambda) \leq +0.2$, the light emission spectrum of the white light source in the spectral luminous efficiency $V(\lambda)$ region is close to the light emission spectrum of the black-body radiation, in other words, the light emission spectrum of the natural light. That is, if the difference $A(\lambda)$ is zero ($A(\lambda) = 0$), the same light emission spectrum as that of the natural light can be reproduced.

Figure 7:
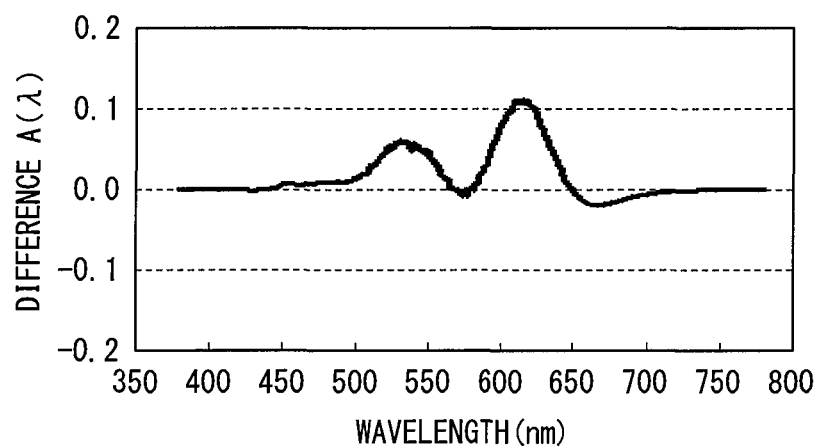
FIG. 7 is a graph showing a difference $A(\lambda)$ in Example 1.

FIG. 7 shows the difference $A(\lambda)$ in Example 1. As is apparent from FIG. 7, in Example 1, the range of the difference $A(\lambda)$ is $-0.03 \leq A(\lambda) \leq +0.11$, and it can be confirmed that the natural light in the daytime is reproduced in Example 1.

As described above, according to the present embodiment, the light emission spectrum is designed to be close to the light emission spectrum of the black-body radiation. Hence, as compared with conventional white LEDs having blue light peaks that stand out to be outstanding, the present embodiment can considerably suppress the adverse effects on a human circadian rhythm.

As described later in examples, the natural light at sunrise and the natural light in the morning can be also reproduced, and hence the light emission spectrum may be controlled so as to suit an intended use.

Further, if white light sources that can reproduce the natural light in the daytime, the natural light at sunrise, and the natural light in the morning are combined, the same natural light as one-day sunlight can be reproduced. For example, if such combined white light sources are used as lighting equipment in a hospital ward and in a place or room used for long-time indoor work, adverse effects on the circadian rhythms of patients who live therein and staffs who work therein can be suppressed. Further, because the natural light can be reproduced, application to agricultural fields such as plant cultivation using the natural light is also possible.

It is preferable that such a white light source have a light emission color temperature of 2,500 to 5,400 K. If this color temperature falls below 2,500 K and exceeds 5,400 K, a deviation of the color temperature from the natural light becomes large, so that there may be a fear that it becomes difficult to control the color temperature. The preferable range of the color temperature is 2,700 to 5,200 K.

The white light source having the difference $A(\lambda)$ as described above comprises: a blue light emitting diode (blue LED) having a light emission peak wavelength in a range of 421 to 490 nm; and a phosphor layer including: two or more, preferably three or more types of phosphors having different peak wavelengths; and resin.

The white light source of the present invention is configured by a system in which the blue light emitting diode is used and the two or more, preferably three or more types of phosphors are excited by the blue light emitted from the blue LED, thereby to obtain a white light.

The light emission peak heights of a blue LED, a green LED, and a red LED each having a light emission peak wavelength larger than 490 nm are large, and hence it is difficult to control the difference $A(\lambda)$ thereof to fall within a range of $-0.2 \ A(\lambda) \leq +0.2$.

Further, the white light source of the present invention is characterized in that an amount of chromaticity change on CIE chromaticity diagram from a time of initial lighting up of the white light source to a time after the white light source is continuously lighted up for 6000 hours is less than 0.010.

A method of measuring the amount of chromaticity change is performed as follows in accordance with JIS-Z-8518. Namely, chromaticity coordinate u', v' of a light emitted from the white light source are respectively measured at a time of initial lighting up of the white light source and at a time after the white light source is continuously lighted up for 6000 hours. Then, differences $\Delta u'$, $\Delta v'$ that are indicated as differences in chromaticity coordinate on the CIE chromaticity diagram are obtained. The amount of chromaticity change is obtained from the following calculation formula:

$$\text{Amount of chromaticity change} = [(\Delta u')^2 + (\Delta v')^2]^{1/2}.$$

In the white light source of the present invention, the amount of chromaticity change can be reduced to be less than 0.010, further, less than 0.009. The amount of chromaticity change of less than 0.010 indicates a state where the chromaticity change is hardly occurred even if the white light source is used for a long period of time from the time of initial lighting up of the white light source. Therefore, the white light source of the present invention can reproduce sunlight for a long period of time.

Further, the white light source of the present invention has a phosphor layer comprising: two or more types, preferably three or more types of phosphors having different peak wavelengths; and resin.

It is preferable that, when the phosphor is excited by a light emission source of 421 to 490 nm, the light emission peak wavelength of the phosphor be in a range of 420 to 700 nm. Further, it is preferable to use two or more types (more preferably four or more types) of phosphor having different peak wavelengths. Further, adjacent peak wavelengths of the phosphors are different (are deviated to each other) by preferably 150 nm or less, more preferably 10 to 100 nm, and still more preferably 10 to 50 nm. That is, from a blue region to a red region, the peak wavelengths different every 10 to 100 nm are combined with the use of two or more types (more preferably three or more types) of phosphor, whereby $-0.2 \leq$ the difference $A(\lambda) \leq +0.2$ can be effectively achieved.

Further, when the types of phosphors having different peak wavelengths are increased to be two or more, preferably three or more, the chromaticity change can be effectively suppressed even if the white light source is used for a long period of time.

Furthermore, in the phosphor layer comprising the phosphor and the resin, a mass ratio of the phosphor included in the phosphor layer is 5 mass % or more and 50 mass % or less. When the mass ratio of the phosphor contained in the phosphor layer is less than 5 mass %, an existing ratio of the phosphor is small, so that a scattering in brightness as a whole phosphor layer is liable to occur. On the other hand, when the mass ratio of the phosphor exceeds 50 mass %, the existing ratio of the phosphor in the phosphor layer becomes excessively large, so that a ratio of the blue light which is emitted from the blue light emitting diode and passing through the phosphor layer is disadvantageously decreased whereby it becomes difficult to obtain a white light.

When the existing ratio (mass ratio) of the phosphor contained in the phosphor layer is controlled, it becomes possible to uniform the brightness, and to suppress a lowering of the brightness even if the white light source is used for a long period of time. The existing ratio (mass ratio) of the phosphor contained in the phosphor layer is preferably set within a range of 7 to 35 mass %.

As a method of measuring the mass ratio of the phosphor, there is a method in which the mass ratio is measured from a mixing ratio of phosphor powder to be used for forming the phosphor layer and the resin. In this case of the method, the mass ratio (%) of the phosphor contained in the phosphor layer is obtained from the following calculation formula:

Mass ratio of phosphor contained in phosphor layer=
[phosphor weight to be mixed/(phosphor weight to be mixed+resin weight to be mixed)]×100 (%)

Further, in a case where the mass ratio of the phosphor is measured from a completed phosphor layer, a predetermined amount of phosphor layer is cut out, and the weight of the cut out sample is measured. Thereafter, the resin component is removed, and the weight of the phosphor is measured. As a result, the mass ratio of the phosphor can be effectively measured from the following calculation formula:

Mass ratio of phosphor contained in phosphor layer=
[phosphor phosphor weight/weight of the cut out sample]×100(%)

In this connection, as a method of removing the resin component, there can be preferably used a method in which the resin component is burned and eliminated in atmosphere and a temperature without causing any oxidation of the phosphor. As the resin constituting the phosphor layer, thermo-hardening resin such as silicone resin or the like are used, so that the mass ratio can be measured by aforementioned method. Further, when the phosphor is not uniformly mixed in the phosphor layer, such non-uniformity will cause a scattering in brightness. Therefore, there is no problem even if the mass ratio of phosphor contained in the phosphor layer, which is measured on the basis of the partially cut out sample, is regarded as the mass ratio represented by an entire phosphor layer.

Further, as described later, in a case where a transparent resin layer is disposed between the phosphor layer and the light emitting diode, this transparent resin layer is not included in the phosphor layer. Furthermore, in case of the globe type white light source, there may be a case where an adhesive layer is provided to a portion between the globe and the phosphor layer. However, the adhesive layer in this case is not included in the phosphor layer. In the present invention, it is important to control the mass ratio of the phosphor in the phosphor layer formed by mixing the phosphor and the resin.

Further, it is also preferable that the phosphor layer has a thickness of 0.01 to 3 mm. When the thickness of the phosphor layer is thin to be less than 0.01 mm, there may be a fear that the emission light emitted from the light emitting diode is excessively passed through the phosphor layer. When the emission light emitted from the light emitting diode is excessively passed through the phosphor layer, it becomes difficult to control the difference $A(\lambda)$ of the white light source to fall within a range of $-0.2 \leq A(\lambda) \leq +0.2$.

On the other hand, when the thickness of the phosphor layer is thick to exceed 3 mm, it becomes difficult to uniformly mix the light emitted from the light emitting diode and the light emitted from the phosphor. As a result, it becomes rather difficult to control the difference $A(\lambda)$ of the white light source to fall within a range of $-0.2 \leq A(\lambda) \leq +0.2$.

Further, it is preferable that the average particle diameter (size) of the phosphor contained in the phosphor layer is set to be 1 µm or more and 80 µm or less, more preferably set to be 3 to 30 µm. If the average particle size is less than 1 µm, the particle size is excessively small, and manufacture of the phosphors is thus difficult, leading to an increase in costs. In addition, the fine powder having an average particle diameter of less than 1 µm has a high aggregating property, so that it is difficult to form a uniform phosphor layer. On the other hand, when the average particle diameter is excessively large to exceed 80 µm, the respective phosphor powder has an excessively large size, so that it becomes difficult to obtain a white light.

It is preferable that, when the phosphor is excited by a light emission source of 421 to 490 nm, the light emission peak wavelength of the phosphor be in a range of 420 to 700 nm. Further, it is preferable to use two or more types, preferably three or more types (more preferably four or more types) of phosphor having different peak wavelengths. Further, adjacent peak wavelengths of the phosphors are different (are deviated to each other) by preferably 150 nm or less, more preferably 10 to 100 nm, and still more preferably 10 to 50 nm. That is, from a blue region to a red region, the peak wavelengths different every 10 to 100 nm are combined with the use of two or more types, preferably three or more types (more preferably four or more types) of phosphor, whereby $-0.2 \le$ the difference $A(\lambda) \le +0.2$ can be effectively achieved.

Further, when the types of phosphors having different peak wavelengths are increased to be two or more, preferably three or more, more preferably four or more, the brightness degradation can be effectively suppressed even if the white light source is used for a long period of time.

The light emission spectrum of the phosphor has an appropriate half band width. Therefore, when the types of phosphor to be mixed are increased, there is caused an over lap of the light emission spectra. At the same time, the light emitting wavelength region of the respective phosphors is over-lapped with a light absorbing band of another phosphor.

More specifically, in a case where a yellow phosphor, green phosphor, red phosphor are mixed (as the occasion demands, a blue phosphor can be also mixed), the emission light emitted from the yellow phosphor excited by a light emitted from the light emitting diode is absorbed by the green and the red phosphor whereby the green phosphor and the red phosphor emit lights. At this time, the green phosphor is excited by two types of exciting sources comprising the light emitted the light emitting diode and the light emitted from the yellow phosphor.

The same phenomenon occurs among the various color light emitting phosphors. Namely, the light emitted from the green phosphor is absorbed by the red phosphor thereby to emit red emission light, and the light emitted from the yellow phosphor is absorbed by the red phosphor thereby to emit a red emission light. As to the red phosphor, the red phosphor has three types of exciting sources comprising the light emitted from the light emitting diode, the light emitted from the green phosphor and the light emitted from the yellow phosphor.

As described above, when the phosphor layer comprising the phosphor which is excited by not only the light emitted from the light emitting diode but also the light emitted from another phosphor, there can be provided a white light source in which durability to deterioration with age is high and brightness degradation is suppressed. In this connection, whether the mutually light-absorbing property exists or not among the phosphors can be easily proved by investigating excitation spectra of the respective phosphors.

The material for constituting each phosphor is not particularly limited as long as the light emission peak thereof is in a range of 420 to 700 nm, and the following phosphors are preferable as phosphors excited at 421 to 490 nm. Further, the half-value width (half band width) of the peak wavelength of the light emission spectrum of each phosphor is as wide as preferably 40 nm or more and more preferably 50 to 100 nm. When the above half-value width is controlled to the above range, the mutually light-absorbing can be easily conducted.

Concrete examples of the blue phosphor (B) may include a europium-activated alkaline-earth phosphate phosphor (a peak wavelength of 440 to 455 nm) and a europium-activated barium magnesium aluminate phosphor (a peak wavelength of 450 to 460 nm) or the like. Further, examples of the blue-green phosphor may include a europium-activated strontium aluminate phosphor (a peak wavelength of 480 to 500 nm) and a europium- and manganese-activated barium magnesium aluminate phosphor (a peak wavelength of 510 to 520 nm) or the like.

Concrete examples of the green phosphor (G) may include a europium-activated orthosilicate phosphor (a peak wavelength of 520 to 550 nm), a europium-activated β-sialon phosphor (a peak wavelength of 535 to 545 nm), and a europium-activated strontium sialon phosphor (a peak wavelength of 510 to 530 nm) or the like.

Concrete examples of the yellow phosphor (Y) may include a europium-activated orthosilicate phosphor (a peak wavelength of 550 to 580 nm) and a cerium-activated rare-earth aluminum garnet phosphor (a peak wavelength of 550 to 580 nm) or the like.

Concrete examples of the red phosphor (R) may include a europium-activated strontium sialon phosphor (a peak wavelength of 600 to 630 nm), a europium-activated calcium strontium oxynitride phosphor (a peak wavelength of 610 to 650 nm), a europium-activated lanthanum oxysulfide phosphor (a peak wavelength of 620 to 630 nm), a manganese-activated magnesium fluorogermanate (a peak wavelength of 640 to 660 nm), and a europium-activated alkaline-earth nitride phosphor (a peak wavelength of 600 to 650 nm) or the like.

In order to control the difference $A(\lambda)$, it is preferable to use two or more types (more preferably three or more types) of phosphor from among the above-mentioned examples of the blue phosphor, the blue-green phosphor, the green phosphor, the yellow phosphor, and the red phosphor. Further, the color temperature can be controlled by changing the mixing proportion of the phosphors.

Further, it is preferable that a space is formed to a portion between the phosphor layer and the light emitting diode. Furthermore, it is also preferable that the phosphor layer is provided on the light emitting diode. Still further, it is also preferable that the phosphor layer is provided on the light emitting diode through a transparent resin layer.

Figure 19:
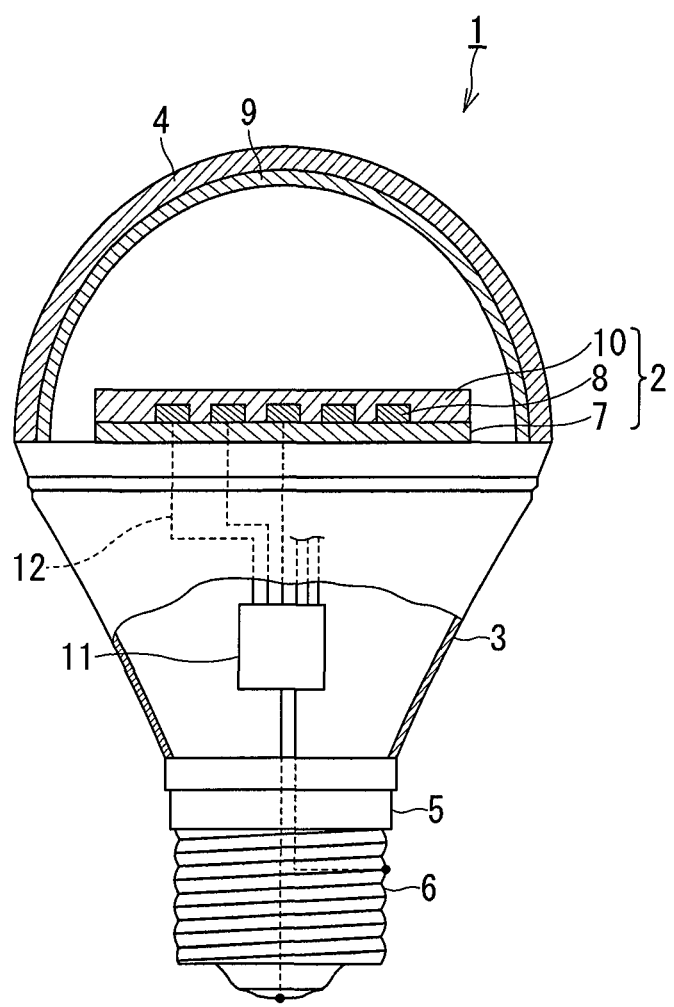
FIG. 19 is a cross sectional view illustrating an embodiment of a bulb-type white light source according to the present invention.

Next, a structure of the white light source will be explained. FIG. 19 illustrates a bulb-type white light source as an embodiment of the white light source according to the present invention. In FIG. 19, a reference numeral of 1 denotes an LED bulb (white light source), 2 denotes an LED module, 3 denotes a base body, 4 denotes a globe, 5 denotes an insulating member, 6 denotes a cap, 7 denotes a substrate, 8 denotes LED chips, 9 denotes a phosphor layer, and 10 denotes a transparent resin layer. FIG. 19 shows one example of a structure in which the space is formed to a portion between the phosphor layer and the light emitting diode.

That is, the LED bulb 1 illustrated in FIG. 19 includes: the LED module 2; the base body 3 to which the LED module 2 is arranged; the globe 4 as a housing that is attached to an upper portion of the base body 3 so as to cover the LED module 2; the cap 6 that is attached to a lower end part of the base body 3 with the intermediation of the insulating member 5; and a lighting circuit 11 provided inside of the base body 3.

The LED module 2 includes the LED chips 8 that emit ultraviolet to violet light and are mounted on the substrate 7. The plurality of LED chips 8 are surface-mounted on the substrate 7. For example, InGaN-based, GaN-based, and AlGaN-based light emitting diodes or the like are used for the LED chips 8 that emit ultraviolet to violet light.

A wiring network (not illustrated) is provided on a surface of the substrate 7 (further provided inside thereof as needed), and an electrode of each LED chip 8 is electrically connected to the wiring network of the substrate 7. Wiring lines 12 are drawn out from a side surface or a bottom surface of the LED module 2, and the wiring lines 12 are electrically connected to the lighting circuit 11 provided inside of the base body 3. The LED chips 8 are turned on by DC voltage applied via the lighting circuit 11.

The phosphor layer 9 that absorbs blue light emitted from the LED chips 8 and emits white light is provided on an inner surface of the globe 4 as housing. The phosphor layer 9 is formed by combining two or more types (more preferably four or more types) of phosphor having different peak wavelengths. Further, all the phosphors may be mixed to form a mixed phosphor layer. Alternatively, phosphor layers formed by mixing about one to three types of phosphor are laminated to form a multi-layered phosphor layer.

Although FIG. 19 illustrates a structure in which the phosphor layer is provided on the inner surface of the globe 4, the phosphor layer may be provided on an outer surface of the globe 4, the phosphors may be mixed in a resin globe 4 itself, and the phosphor particles may be mixed in the transparent resin layer 10.

Further, not limited to the above-mentioned bulb types, the white light source according to the present invention can also be applied to a fluorescent light type (elongated type), a chandelier type, and the like, and the shape thereof is not particularly limited.

Although FIG. 19 illustrates the bulb-type white light source, the present invention is not limited thereto, and can also be applied to a structure in which the phosphor layer is directly provided on the light emitting diode. Further, in a case where the phosphor layer is provided on the light emitting diode through a transparent resin layer, it is preferable that a thickness of the transparent resin layer is set to within a range of 0.01 to 0.1 mm.

As described above, the difference $A(\lambda)$ is controlled to satisfy $-0.2 \leq A(\lambda) \leq +0.2$, whereby a white light source that reproduces natural light can be provided. Further, white light sources that reproduce the natural light in the daytime, the natural light at sunrise, the natural light in the morning, the natural light in the evening, and the like are combined, whereby a white light source system that reproduces a rhythm of one-day natural light can be configured. As a result, it is possible to provide a white light source and a white light source system that suppress adverse effects on a human body circadian rhythm.

EXAMPLES

Example 1

Blue light emitting diodes each having a light emission peak wavelength of 450 nm were prepared as LED chips. Next, prepared was a mixture including: a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 450 nm.

The average particle size of the respective phosphors was set to 12 μm. Note that the europium-activated strontium sialon red phosphor has the mutually light-absorbing property such that the red phosphor is excited by a light emitted from another phosphor.

The respective phosphors were mixed at a ratio by weight (ratio by mass) of blue-green phosphor:green phosphor:yellow phosphor:red phosphor=20:25:15:40, was mixed with a transparent resin (silicone resin), and was applied to the globe inner surface, whereby the bulb-type white light source illustrated in FIG. 19 was manufactured.

The correlated color temperature of light emission color of thus obtained white light source was 2,700 K. This color temperature of 2,700 K is equivalent to the color temperature of the natural light in the morning.

Further, the thickness of the phosphor layer was set to 0.2 mm. Furthermore, the mass ratio of the phosphor contained in the phosphor layer was 10 mass %. This value was obtained from the mass ratio of the mixed phosphor and the resin.

FIG. 3 shows a result obtained by measuring the light emission spectrum of the bulb-type white light source in Example 1 according to total luminous flux measurement using an integrating sphere in conformity with JIS-C-8152. Further, FIG. 5 shows $(P(\lambda) \times V(\lambda))/(P(\lambda\max1) \times V(\lambda\max1))$ in Example 1, which is obtained by using the spectral luminous distribution $V(\lambda)$ in FIG. 1. Note that $\lambda\max1$ in Example 1 is 574 nm.

Then, FIG. 4 shows the light emission spectrum of black-body radiation having a color temperature of 2,700 K, which is obtained according to Planck's distribution (the expression in FIG. 2). FIG. 6 shows $(B(\lambda) \times V(\lambda)/(B(\lambda\max2) \times V(\lambda\max2))$, which is obtained by assuming that the light emission spectrum in FIG. 4 is $B(\lambda)$. Note that $\lambda\max2$ is 572 nm.

The difference $A(\lambda)$ in Example 1 was obtained according to $[(P(\lambda) \times V(\lambda))/(P(\lambda\max1) \times V(\lambda\max1))-(B(\lambda) \times V(\lambda))/(B(\lambda\max2) \times V(\lambda\max2))]$. FIG. 7 shows the result thereof. As is apparent from FIG. 7, in the white light source in Example 1, the difference $A(\lambda)$ from the light emission spectrum of the natural light in the daytime was in a range of −0.2 to +0.2 in a visible light region of 380 to 780 nm. Specifically, the concrete difference $A(\lambda)$ was −0.03 to +0.11.

Example 2

Blue light emitting diodes each having a light emission peak wavelength of 445 nm were prepared as LED chips. Next, prepared was a mixture including: a europium-activated strontium aluminate blue-green phosphor having a peak wavelength of 490 nm; a europium-activated orthosilicate green phosphor having a peak wavelength of 555 nm; a europium-activated orthosilicate yellow phosphor having a peak wavelength of 555 nm; a europium-activated orthosilicate yellow phosphor having a peak wavelength of 530 nm; and a europium-activated strontium sialon red phosphor having a peak wavelength of 630 nm, as phosphors that emitted light while being irradiated with electromagnetic waves of 445 nm.

Note that the europium-activated strontium sialon red phosphor has the mutually light-absorbing property such that the red phosphor is excited by a light emitted from another phosphor.

The average particle size of the phosphors was set to 17 μm. The respective phosphors were mixed at a ratio by weight (ratio by mass) of blue-green phosphor:green phosphor:yellow phosphor:red phosphor=30:30:20:20, was mixed with a transparent resin (silicone resin), and was applied to the globe inner surface, whereby the bulb-type white light source illustrated in FIG. 19 was manufactured. The correlated color temperature of light emission color of the obtained white light source was 4,100 K. This color temperature of 4,100 K is equivalent to the color temperature of the natural light in the morning.

Further, the thickness of the phosphor layer was set to 0.5 mm. Furthermore, the mass ratio of the phosphor contained in the phosphor layer was 20 mass %. This value was obtained from the mass ratio of the mixed phosphor and the resin.

Figure 8:
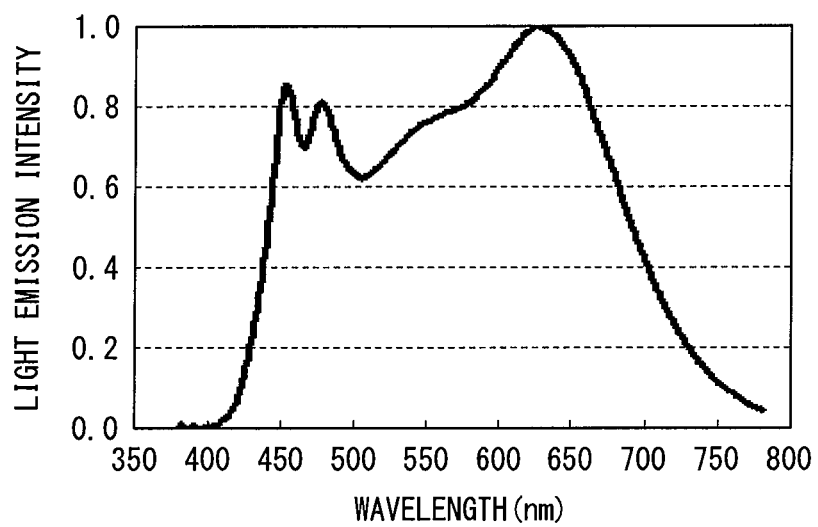
FIG. 8 is a graph showing the light emission spectrum $P(\lambda)$ of a white light source in Example 2.
Figure 10:
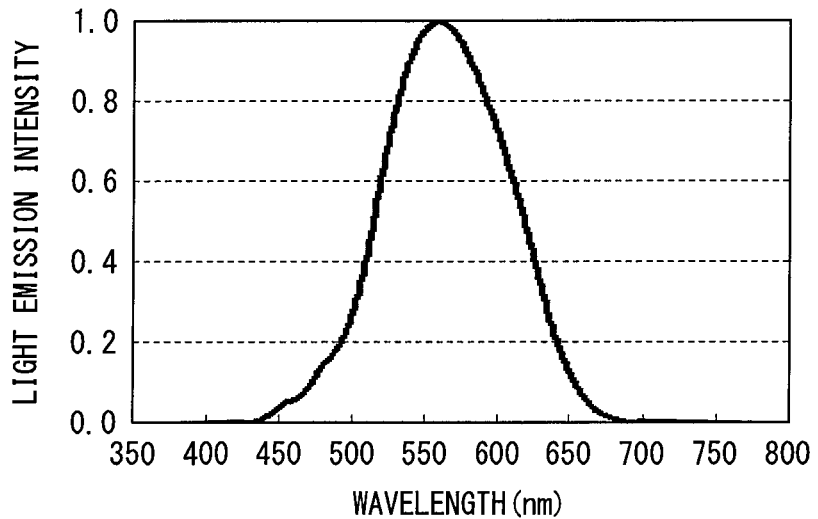
FIG. 10 is a graph showing $(P(\lambda) \times V(\lambda))/(P(\lambda max1) \times V(\lambda max1))$ in Example 2.

Similarly to Example 1, the light emission spectrum of the white light source in Example 2 was checked according to total luminous flux measurement using an integrating sphere. FIG. 8 shows the result thereof. FIG. 10 shows $(P(\lambda) \times V(\lambda))/(P(\lambda max1) \times V(\lambda max1))$ in Example 2, which is obtained by using the spectral luminous efficiency $V(\lambda)$ shown in FIG. 1. Note that $\lambda max1$ in Example 2 is 559 nm.

Figure 9:
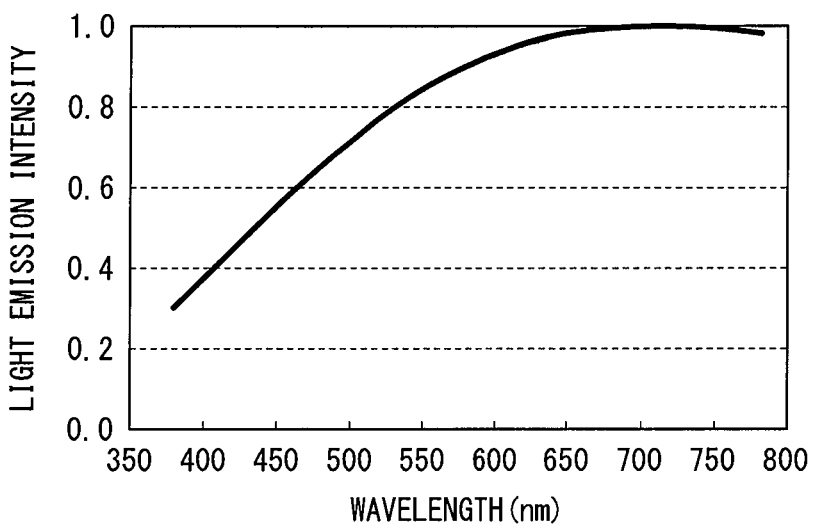
FIG. 9 is a graph showing a light emission spectrum $B(\lambda)$ of black-body radiation in Example 2 (color temperature of 4100K).
Figure 11:
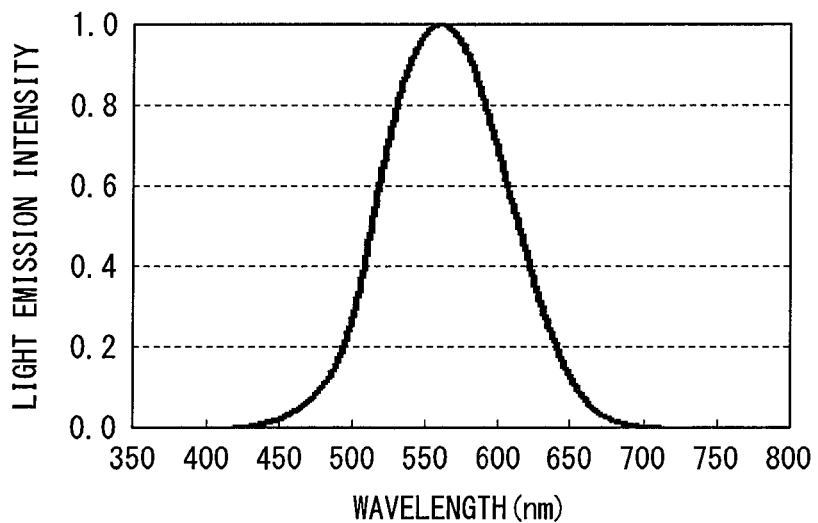
FIG. 11 is a graph showing $(B(\lambda) \times V(\lambda))/(B(\lambda max2) \times V(\lambda max2))$ in Example 2 (color temperature of 4100K).

Then, FIG. 9 shows the light emission spectrum of black-body radiation having a color temperature of 4,100 K, which is obtained according to Planck's distribution (the expression in FIG. 2). FIG. 11 shows $(B(\lambda) \times V(\lambda))/(B(\lambda max2) \times V(\lambda max2))$, which is obtained by assuming that the light emission spectrum in FIG. 9 is $B(\lambda)$. Note that $\lambda max2$ is 560 nm.

Figure 12:
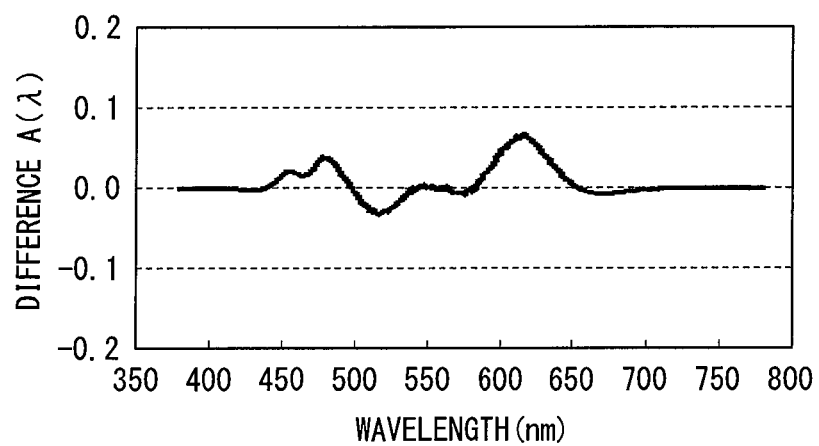
FIG. 12 is a graph showing a difference $A(\lambda)$ in Example 2.

The difference $A(\lambda)$ in Example 2 was obtained according to $[(P(\lambda) \times V(\lambda))/(P(\lambda max1) \times V(\lambda max1))-(B(\lambda) \times V(\lambda))/(B(\lambda max2) \times V(\lambda max2))]$. FIG. 12 shows the result thereof. As is apparent from FIG. 12, in the white light source in Example 2, the difference $A(\lambda)$ from the light emission spectrum of the natural light in the morning is in a range of −0.2 to +0.2 in a visible light region of 380 to 780 nm. Specifically, the concrete difference $A(\lambda)$ is −0.04 to +0.07.

Example 3

Blue light emitting diodes each having a light emission peak wavelength of 450 nm were prepared as LED chips. Prepared was a mixture including: a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 450 nm.

Note that the europium-activated strontium sialon red phosphor has the mutually light-absorbing property such that the red phosphor is excited by a light emitted from another phosphor.

The average particle size of the phosphors was set to 11 μm. The phosphors were mixed at a ratio by weight of blue-green phosphor:green phosphor:yellow phosphor:red phosphor=40:30:10:20, was mixed with a transparent resin (silicone resin), and was applied to the globe inner surface, whereby the bulb-type white light source illustrated in FIG. 19 was manufactured. The correlated color temperature of light emission color of the obtained white light source was 5,400 K. This color temperature of the white light source is equivalent to the color temperature of the natural light in daytime.

Further, the thickness of the phosphor layer was set to 0.3 mm. Furthermore, the mass ratio of the phosphor contained in the phosphor layer was 15 mass %. This value was obtained from the mass ratio of the mixed phosphor and the resin.

Figure 13:
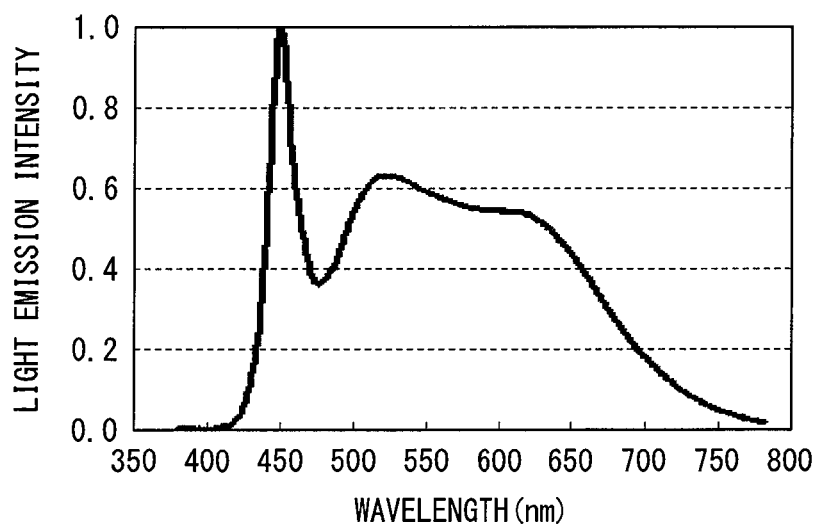
FIG. 13 is a graph showing a light emission spectrum $P(\lambda)$ in Example 3.
Figure 15:
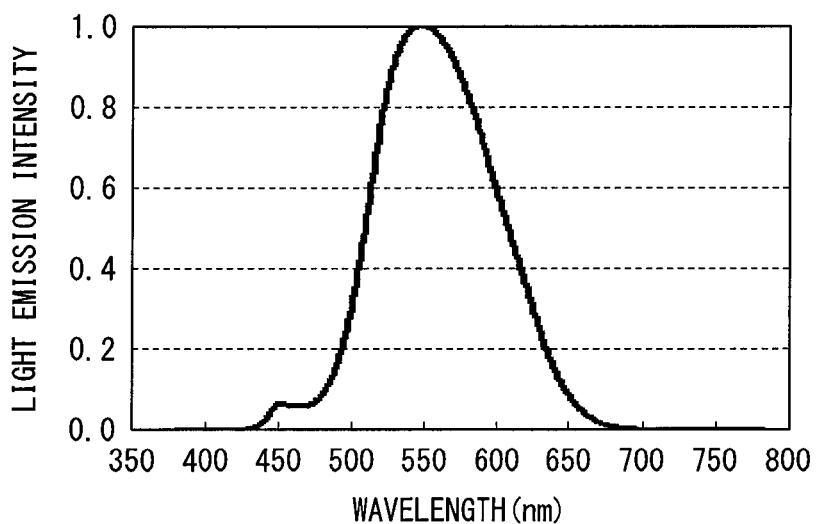
FIG. 15 is a graph showing $(P(\lambda) \times V(\lambda))/(P(\lambda max1) \times V(\lambda max1))$ in Example 3.

Similarly to Example 1, the light emission spectrum of the white light source in Example 3 was checked according to total luminous flux measurement using an integrating sphere. FIG. 13 shows the result thereof. FIG. 15 shows $(P(\lambda) \times V(\lambda))/(P(\lambda max1) \times V(\lambda max1))$ in Example 3, which is obtained using the spectral luminous efficiency $V(\lambda)$ shown in in FIG. 1. Note that $\lambda max1$ in Example 3 is 550 nm.

Figure 14:
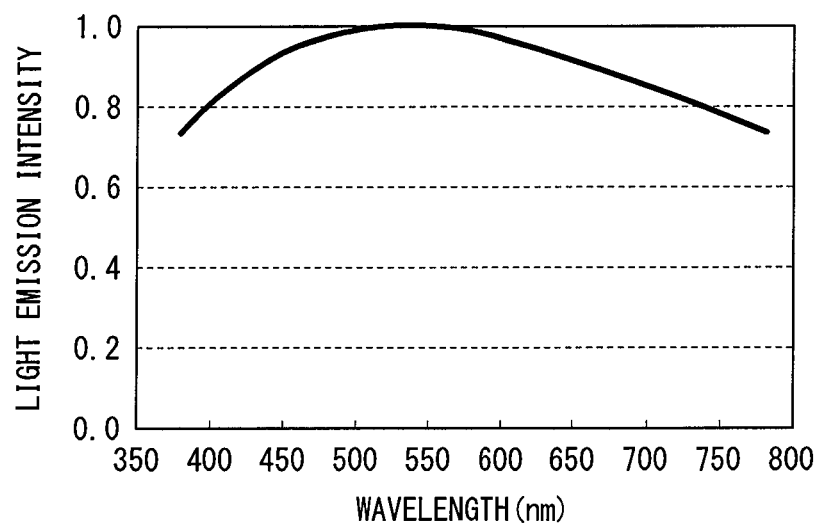
FIG. 14 is a graph showing a light emission spectrum $B(\lambda)$ of black-body radiation in Example 3 (color temperature of 5400K).
Figure 16:
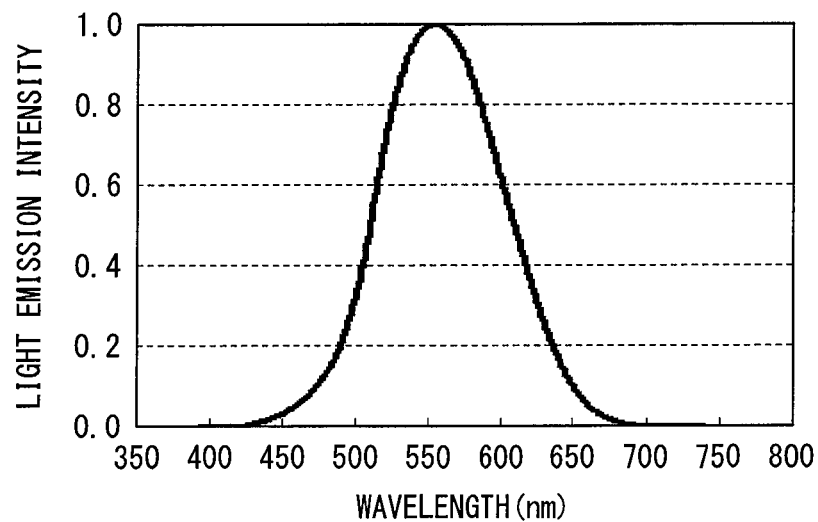
FIG. 16 is a graph showing $(B(\lambda) \times V(\lambda))/(B(\lambda max2) \times V(\lambda max2))$ in Example 3 (color temperature of 5400K).

Then, FIG. 14 shows the light emission spectrum of black-body radiation having a color temperature of 5,400 K, which is obtained according to Planck's distribution (the expression in FIG. 2). FIG. 16 shows $(B(\lambda) \times V(\lambda))/(B(\lambda max2) \times V(\lambda max2))$, which is obtained by assuming that the light emission spectrum in FIG. 14 is $B(\lambda)$. Note that $\lambda max2$ is 555 nm.

Figure 17:
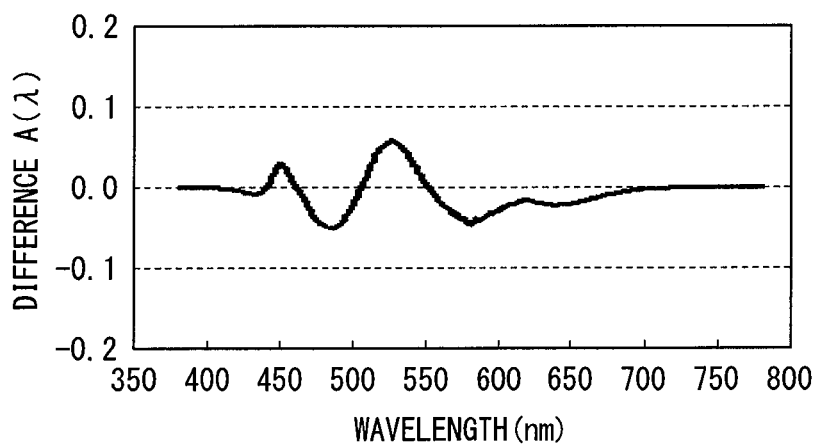
FIG. 17 is a graph showing a difference $A(\lambda)$ in Example 3.

The difference $A(\lambda)$ in Example 3 was obtained according to $[(P(\lambda) \times V(\lambda))/(P(\lambda max1) \times V(\lambda max1))-(B(\lambda) \times V(\lambda))/(B(\lambda max2) \times V(\lambda max2))]$. FIG. 17 shows the result thereof. As is apparent from FIG. 17, in the white light source in Example 3, the difference $A(\lambda)$ from the light emission spectrum of the natural light at sunrise is in a range of −0.2 to +0.2 in a visible light region of 380 to 780 nm. Specifically, the concrete difference $A(\lambda)$ is −0.06 to +0.06.

Comparative Example 1

A blue light emitting diode having a light emission peak wavelength of 460 nm was combined with a cerium-activated yttrium aluminum garnet yellow phosphor (having an average particle diameter of 5 μm), whereby a white light source in Comparative Example 1 was manufactured.

In this regard, the phosphor layer was formed in such a manner that the silicone resin was mixed with cerium-activated yttrium aluminum garnet yellow phosphor, followed by directly applying the mixture onto the light emitting diode thereby to form the phosphor layer having a thickness of 0.1 mm.

Further, the mass ratio of the phosphor contained in the phosphor layer was 7 mass %. This value was obtained from the mass ratio of the mixed phosphor and the resin.

Figure 18:
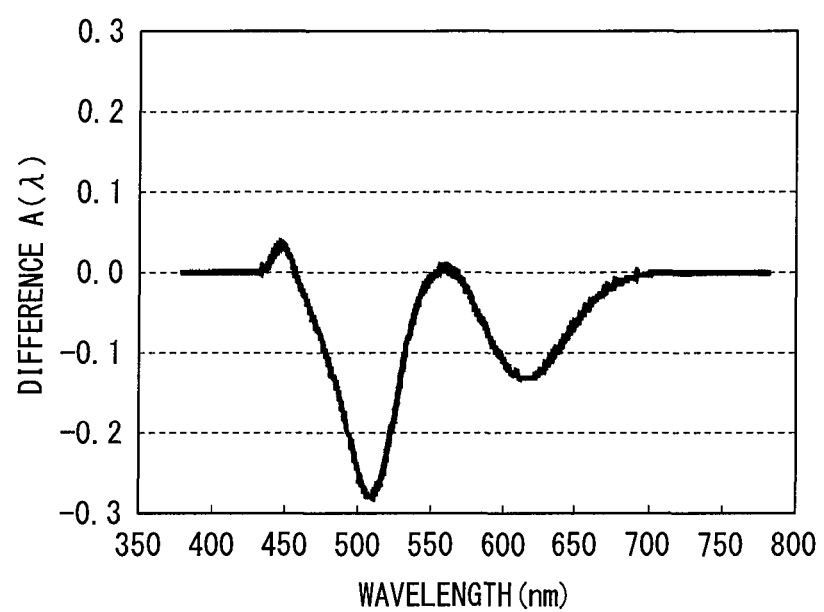
FIG. 18 is a graph showing a difference $A(\lambda)$ in Comparative Example 1.

The color temperature of the white light source in Comparative Example 1 was 5,100 K, and the difference $A(\lambda)$ thereof was −0.28 to +0.04 as shown in FIG. 18.

Subjects (ten persons) spent from 9:00 to 17:00 in the daytime under the white light source in each of the above-mentioned Examples and Comparative Example 1 at the same intensity of illumination, and the amount of secreted melatonin was measured at night (21:00) of the same day. Note that the amount of secreted melatonin was analyzed according to a saliva test. The amount of secreted melatonin (the average value of the ten persons) in each of the above-mentioned Examples was measured assuming that the amount of secreted melatonin in Comparative Example 1 was 100. Table 1 shows the results thereof.

TABLE 1

| SAMPLE No. | AMOUNT OF SECRETED MELATONIN |
|---|---|
| EXAMPLE 1 | 120 |
| EXAMPLE 2 | 116 |
| EXAMPLE 3 | 113 |
| COMPARATIVE EXAMPLE 1 | 100 |

As is apparent from the results shown in Table 1, the amount of melatonin secreted in the subjects was larger in the white light source in each of the above-mentioned examples than that in the conventional white light source in Comparative Example 1. Melatonin is one of hormones secreted from the pineal body in a brain, and it is generally said that the amount of secreted melatonin is smaller during the day and is larger during the night. This is considered to be because humans live under natural light in the daytime. Hence, melatonin is considered as a hormone necessary to have restful sleep. Further, melatonin is widely used as supplements for preventing oxidation in the body in the U.S. and other countries.

Accordingly, with the use of the white light sources in the above-mentioned examples under circumstances where exposure to natural light is difficult (such as a hospital ward and a long-time indoor activity), an effect equivalent to that obtained by exposure to natural light can be obtained, and an effect of suppressing a sleep disorder and a circadian rhythm disturbance can be expected.

Example 4

Blue light emitting diodes each having a light emission peak wavelength of 450 nm were prepared as LED chips. Next, prepared was a mixture including: a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; a europium-activated orthosilicate yellow phosphor having a peak wavelength of 530 nm; and a europium-activated strontium sialon red phosphor having a peak wavelength of 630 nm, as phosphors that emitted light while being irradiated with electromagnetic waves of 450 nm.

Note that the europium-activated strontium sialon red phosphor has the mutually light-absorbing property such that the red phosphor is excited by a light emitted from another phosphor.

The average particle size of the phosphors was set to 18 μm. The respective phosphors were mixed at a ratio by weight (ratio by mass) of blue-green phosphor:green phosphor:yellow phosphor:red phosphor=20:25:15:40, was mixed with a transparent resin (silicone resin), and a phosphor layer was directly formed on the light emitting diode by using the mixture. Example 4 is a one-chip-type white light source.

Further, the thickness of the phosphor layer was set to 0.1 mm. Furthermore, the mass ratio of the phosphor contained in the phosphor layer was 10 mass %. This value was obtained from the mass ratio of the mixed phosphor and the resin.

The correlated color temperature of light emission color of the obtained white light source was 2,700 K. This color temperature of 2,700 K is equivalent to the color temperature of the natural light of the morning sun. The light emission spectrum of Example 4 was checked. As a result, the light emission spectrum of Example 4 was the same as that of Example 1, and the difference A(λ) in Example 4 was −0.03 to +0.11.

Example 5

Blue light emitting diodes each having a light emission peak wavelength of 445 nm were prepared as LED chips. Next, prepared was a mixture including: a europium-activated strontium aluminate blue-green phosphor having a peak wavelength of 490 nm; a europium-activated orthosilicate green phosphor having a peak wavelength of 530 nm; a europium-activated orthosilicate green phosphor having a peak wavelength of 555 nm; a europium-activated orthosilicate yellow phosphor having a peak wavelength of 555 nm; a europium-activated orthosilicate yellow phosphor having a peak wavelength of 530 nm; and a europium-activated strontium sialon red phosphor having a peak wavelength of 630 nm, as phosphors that emitted light while being irradiated with electromagnetic waves of 445 nm.

Note that the europium-activated strontium sialon red phosphor has the mutually light-absorbing property such that the red phosphor is excited by a light emitted from another phosphor.

The average particle size of the phosphors was set to 8 μm. The respective phosphors were mixed at a ratio by weight (ratio by mass) of blue-green phosphor:green phosphor:yellow phosphor:red phosphor=30:30:20:20, was mixed with a transparent resin (silicone resin).

Next, a transparent resin layer (composed of silicone resin) having a thickness of 0.01 mm was provided onto the light emitting diode, and then a phosphor layer was provided on the transparent resin layer. Example 5 is a one-chip-type white light source. At this time, the thickness of the phosphor layer was set to 0.2 mm. Furthermore, the mass ratio of the phosphor contained in the phosphor layer was 8 mass %. This value was obtained from the mass ratio of the mixed phosphor and the resin.

The correlated color temperature of light emission color of the obtained white light source 1 was 4,100 K. This color temperature of 4,100 K is equivalent to the color temperature of the natural light in the morning. The light emission spectrum of Example 5 was checked. As a result, the light emission spectrum of Example 5 was the same as that of Example 2, and the difference A(λ) in Example 4 was −0.04 to +0.07.

Example 6

Blue light emitting diodes each having a light emission peak wavelength of 450 nm were prepared as LED chips. Next, prepared was a mixture including: a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 450 nm.

The average particle size of the phosphors was set to 15 μm. The respective phosphors were mixed at a ratio by weight (ratio by mass) of blue-green phosphor:green phosphor:yellow phosphor:red phosphor=40:30:10:20, was mixed with a transparent resin (silicone resin).

Next, a transparent resin layer (composed of silicone resin) having a thickness of 0.02 mm was provided onto the light emitting diode, and then a phosphor layer was provided on the transparent resin layer. Example 6 is a one-chip-type white light source. At this time, the thickness of the phosphor layer was set to 0.3 mm. Furthermore, the mass ratio of the phosphor contained in the phosphor layer was 12 mass %. This value was obtained from the mass ratio of the mixed phosphor and the resin.

The correlated color temperature of light emission color of the obtained white light source 1 was 5,400 K. This color temperature of 5,400 K is equivalent to the color temperature of the natural light in daytime. The light emission spectrum of Example 6 was checked. As a result, the light emission spectrum of Example 6 was the same as that of Example 3, and the difference A(λ) in Example 4 was −0.06 to +0.06.

As the same measuring method as in Example 1, the amount of secreted melatonin (the average value of the ten persons) in each of the white light sources of above-mentioned Examples 4 to 6 was measured. Table 2 hereunder shows the results thereof.

TABLE 2

| SAMPLE No. | AMOUNT OF SECRETED MELATONIN |
|---|---|
| EXAMPLE 4 | 122 |
| EXAMPLE 5 | 118 |
| EXAMPLE 6 | 114 |

As is apparent from the results shown in Table 2, the amount of melatonin secreted in the subjects was larger in the white light source in each of the above-mentioned examples than that in the conventional white light source in Comparative Example 1.

In the above-mentioned examples, the natural light at sunrise (Example 1 and Example 4), the natural light in the morning (Example 2 and Example 5) and the natural light in the daytime (Example 3 and Example 6) were separately made. Alternatively, a white light source system is configured by combining the plurality of types of light as appropriate, whereby light equivalent to one-day natural light can be also reproduced.

Figure 20:
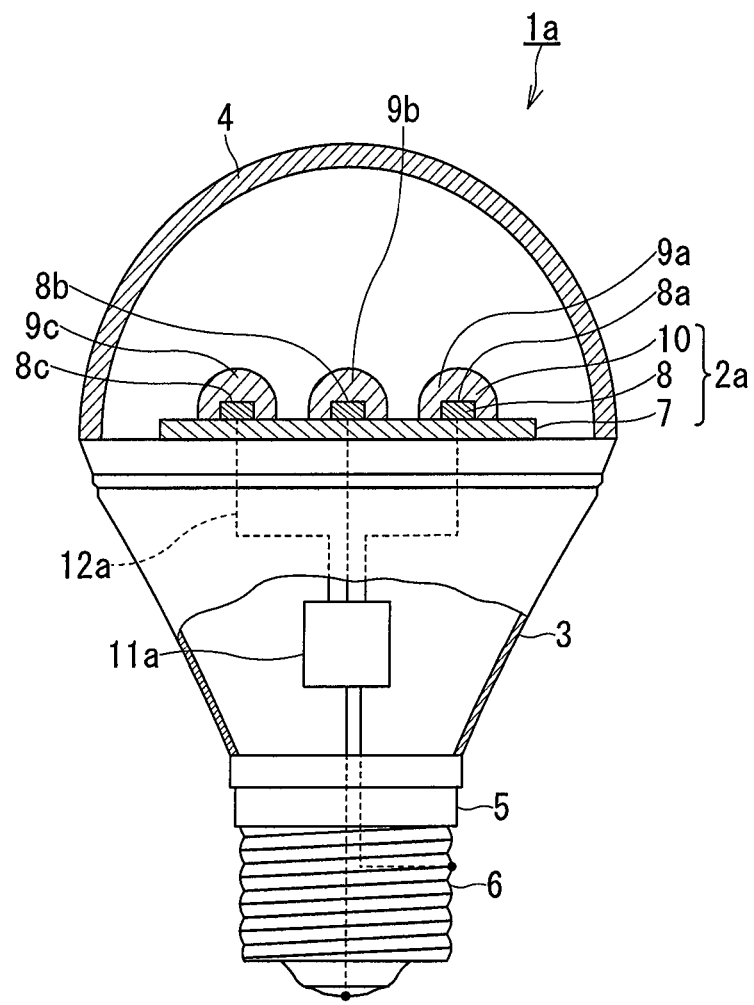
FIG. 20 is a cross sectional view illustrating another embodiment of the bulb-type white light source according to the present invention.

Specifically, as illustrated in FIG. 20, an LED chip 8a and a phosphor layer 9a for emitting the natural light in the daytime, an LED chip 8b and a phosphor layer 9b for emitting the natural light at sunrise, and an LED chip 8c and a phosphor layer 9c for emitting the natural light in the morning may be placed together on a common substrate 7. Then, the LED chips 8a, 8b, and 8c may be housed in the same globe 4, whereby a white light source system 1a may be configured.

The LED chips 8a, 8b, and 8c are each connected to a lighting circuit 11a by a wiring line 12a. A user can select an LED chip to be turned on by means of a switching mechanism (not illustrated) attached to the lighting circuit 11a, as desired.

According to the white light source system 1a configured as described above, the natural light in the daytime, the natural light at sunrise, and the natural light in the morning can be selectively enjoyed from one white light source system 1a, in accordance with a user's desire and an illumination cycle. That is, white light sources that reproduce the natural light in the daytime, the natural light at sunrise, the natural light in the morning, the natural light in the evening, and the like are combined, whereby a white light source system that reproduces a rhythm of one-day natural light can be configured.

Examples 7-8

As shown in Table 3, a combination of phosphors was changed and the respective phosphors were mixed so that the difference $A(\lambda)$ was set to fall within a range of −0.2 to +0.2, whereby the bulb-type white light source having a color temperature of 2,700 K, which is the same as that of Example 1, was manufactured.

The average particle diameter of the phosphor was set to fall within a range of 5 to 15 μm, and the thickness of the phosphor layer was set to fall within a range of 0.1 to 0.5 mm. Further, the red phosphor shown in Table 3 is excited by not only a light emitted from the LED but also a light emitted from the green phosphor or the like.

TABLE 3

| | PHOSPHOR (MIXING RATIO:MASS RATIO %) | | | | DIFFERENCE A |
|---|---|---|---|---|---|
| SAMPLE No. | BLUE-GREEN | GREEN | YELLOW | RED | $(\lambda)$ |
| EXAMPLE 7 | Eu-ACTIVATED STRONTIUM ALUMINATE PHOSPHOR (20) | Eu-ACTIVATED ORTHO-SILICATE PHOSPHOR (25) | Eu-ACTIVATED ORTHO-SILICATE PHOSPHOR (15) | Eu-ACTIVATED ALKALINE-EARTH NITRIDE PHOSPHOR (40) | −0.15~+0.18 |
| EXAMPLE 8 | NONE | Eu-ACTIVATED βSIALON PHOSPHOR (30) | Eu-ACTIVATED ORTHO-SILICATE PHOSPHOR (20) | Eu-ACTIVATED ALKALINE-EARTH NITRIDE PHOSPHOR (50) | −0.16~+0.19 |

Examples 9-10

As shown in Table 4, a combination of phosphors was changed and the respective phosphors were mixed so that the difference $A(\lambda)$ was set to fall within a range of −0.2 to +0.2, whereby the bulb-type white light source having a color temperature of 4,100 K, which is the same as that of Example 2, was manufactured.

The average particle diameter of the phosphor was set to fall within a range of 5 to 15 μm, and the thickness of the phosphor layer was set to fall within a range of 0.1 to 0.5 mm. Further, the red phosphor shown in Table 4 is excited by not only a light emitted from the LED but also a light emitted from the green phosphor or the like.

TABLE 4

| | PHOSPHOR (MIXING RATIO:MASS RATIO %) | | | | DIFFERENCE A |
|---|---|---|---|---|---|
| SAMPLE No. | BLUE-GREEN | GREEN | YELLOW | RED | $(\lambda)$ |
| EXAMPLE 9 | Eu-ACTIVATED STRONTIUM ALUMINATE PHOSPHOR | Eu-ACTIVATED ORTHO-SILICATE PHOSPHOR | Eu-ACTIVATED ORTHO-SILICATE PHOSPHOR | Eu-ACTIVATED ALKALINE-EARTH NITRIDE | −0.12~+0.14 |

TABLE 4-continued

| SAMPLE No. | PHOSPHOR (MIXING RATIO:MASS RATIO %) | | | | DIFFERENCE A ($\lambda$) |
|---|---|---|---|---|---|
| | BLUE-GREEN | GREEN | YELLOW | RED | |
| | | (30) | (20) | (20) | |
| | | | | PHOSPHOR (30) | |
| EXAMPLE 10 | NONE | Eu-ACTIVATED βSIALON PHOSPHOR (35) | Eu-ACTIVATED ORTHO-SILICATE PHOSPHOR (25) | Eu-ACTIVATED ALKALINE-EARTH NITRIDE PHOSPHOR (40) | −0.13~+0.16 |

Examples 11-12

As shown in Table 5, a combination of phosphors was changed and the respective phosphors were mixed so that the difference $A(\lambda)$ was set to fall within a range of −0.2 to +0.2, whereby the bulb-type white light, source having a color temperature of 5,400 K, which is the same as that of Example 3, was manufactured.

The average particle diameter of the phosphor was set to fall within a range of 5 to 15 μm, and the thickness of the phosphor layer was set to fall within a range of 0.1 to 0.5 mm. Further, the red phosphor shown in Table 5 is excited by not only a light emitted from the LED but also a light emitted from the green phosphor or the like.

TABLE 5

| SAMPLE No. | PHOSPHOR (MIXING RATIO:MASS RATIO %) | | | | DIFFERENCE A ($\lambda$) |
|---|---|---|---|---|---|
| | BLUE-GREEN | GREEN | YELLOW | RED | |
| EXAMPLE 11 | Eu-ACTIVATED STRONTIUM ALUMINATE PHOSPHOR (40) | Eu-ACTIVATED ORTHO-SILICATE PHOSPHOR (30) | Eu-ACTIVATED ORTHO-SILICATE PHOSPHOR (10) | Eu-ACTIVATED ALKALINE-EARTH NITRIDE PHOSPHOR (20) | −0.11~+0.11 |
| EXAMPLE 12 | NONE | Eu-ACTIVATED βSIALON PHOSPHOR (45) | Eu-ACTIVATED ORTHO-SILICATE PHOSPHOR (20) | Eu-ACTIVATED ALKALINE-EARTH NITRIDE PHOSPHOR (35) | −0.12~+0.14 |

Examples 1A-12A and Comparative Example 1A

The white light sources of Examples 1-12 and Comparative Example 1 were operated thereby to investigate a chromaticity change characteristic thereof.

An amount of the chromaticity change is measured by a method comprising the following steps. First, the light emission spectrum of the respective white light sources is measured by using an integrating sphere, thereby to obtain chromaticity coordinate (u' v') of the emitted light through a calculation. Then, a chromaticity coordinate (u' v') at a time after one hour have passed from the initially lighting up the white light source.

Next, the white light source is continuously lighted up as it is for 6000 hours, and the chromaticity coordinate (u' v') at a time after 6000 hours have passed is measured. In this connection, the measuring operation was performed in an indoor environment having a room temperature (25° C.) and humidity of 60%.

From the chromaticity coordinate (u' v') at a time after one hour have passed and the chromaticity coordinate (u' v') at a time after 6000 hours have passed, differences Δu' and Δv' are obtained. As a result, the amount of chromaticity change was obtained from a calculation formula:

$$\text{Amount of chromaticity change} = [(\Delta u')^2 + (\Delta v')^2]^{1/2}$$

Table 6 hereunder shows the results thereof.

TABLE 6

| SAMPLE No. | WHITE LIGHT SOURCE | AMOUNT OF CHROMATICITY CHANGE AFTER CONTINUOUS LIGHTING-UP FOR 6000 HOURS |
|---|---|---|
| EXAMPLE 1A | EXAMPLE 1 | 0.005 |
| EXAMPLE 2A | EXAMPLE 2 | 0.007 |
| EXAMPLE 3A | EXAMPLE 3 | 0.006 |
| EXAMPLE 4A | EXAMPLE 4 | 0.008 |
| EXAMPLE 5A | EXAMPLE 5 | 0.007 |
| EXAMPLE 6A | EXAMPLE 6 | 0.009 |
| EXAMPLE 7A | EXAMPLE 7 | 0.009 |
| EXAMPLE 8A | EXAMPLE 8 | 0.008 |
| EXAMPLE 9A | EXAMPLE 9 | 0.007 |
| EXAMPLE 10A | EXAMPLE 10 | 0.006 |
| EXAMPLE 11A | EXAMPLE 11 | 0.008 |
| EXAMPLE 12A | EXAMPLE 12 | 0.008 |
| COMPARATIVE EXAMPLE 1A | COMPARATIVE EXAMPLE 1 | 0.018 |

As is apparent from the results shown in Table 6, the chromaticity change was confirmed to be suppressed in the white light sources of the respective Examples of the present invention. Therefore, it was also confirmed that there can be provided a white light source having a high reliability, and capable of reproducing a natural light, and suppressing the chromaticity change.

With respect to the following white light sources of the respective Examples, a brightness degradation of the emission light was investigated.

Examples 1A-6A and Comparative Example 2A

The white light sources of Examples 1-6 and Comparative Example 1 were operated thereby to investigate a brightness degradating property thereof.

The brightness degradating property is measured by a method comprising the following steps. First, each of the white light sources is turned on (lighted up) in an integrating sphere, thereby to measure a total luminous flux thereof.

A measuring environment was a dark place having a normal temperature (25° C.) and a humidity of 60%. Under these environmental conditions, the total luminous flux at a time after one hour have passed from the initially turning on the white light source.

Next, the white light source is continuously turned on for 5000 hours, and the total luminous flux at a time after 5000 hours have passed was measured thereby to obtain a difference in brightness.

From the total luminous flux at a time after one hour have passed and the total luminous flux at a time after 5000 hours have passed, a brightness degradation was obtained.

Concretely, the brightness degradation was obtained from a calculation formula:

Brightness Degradation=[(Brightness at time after turning on for one hour−Brightness at time after turning on for 5000 hours)/Brightness at time after turning on for one hour]×100(%)

Further, the white light source of Comparative Example 2 was manufactured so as to have the same structure as that of Example 1 except that the mass ratio of the phosphor contained in the phosphor layer was set to 2%. Table 7 hereunder shows the measuring results thereof.

TABLE 7

| SAMPLE No. | WHITE LIGHT SOURCE | BRIGHTNESS DEGRADATION(%) |
|---|---|---|
| EXAMPLE 1A | EXAMPLE 1 | 2.1 |
| EXAMPLE 2A | EXAMPLE 2 | 2.4 |
| EXAMPLE 3A | EXAMPLE 3 | 2.5 |
| EXAMPLE 4A | EXAMPLE 4 | 1.9 |
| EXAMPLE 5A | EXAMPLE 5 | 2.0 |
| EXAMPLE 6A | EXAMPLE 6 | 2.3 |
| COMPARATIVE EXAMPLE 2A | COMPARATIVE EXAMPLE 2 | 6.3 |

As is apparent from the results shown in Table 7, the brightness degradation was confirmed to be suppressed in the white light sources of the respective Examples of the present invention. Therefore, it was also confirmed that there can be provided a white light source having a high reliability, and capable of reproducing a natural light, and suppressing the brightness degradation.

INDUSTRIAL APPLICABILITY

A white light source and a white light source system according to the present invention can reproduce the same light emission spectrum as that of natural light. Accordingly, even if a human body is exposed to white light emitted from the white light source for a long time, adverse effects on the human body can be made equivalent to those of natural light.

Further, in a case where three types or more of phosphors having different peak wavelengths are used, there can be provided a white light source having a high reliability, and capable of effectively suppressing the chromaticity change even if the white light source is used for a long period of time.

DESCRIPTION OF SYMBOLS

1 . . . LED bulb (white light source), 1a . . . white light source system, 2, 2a . . . LED module, 3 . . . base body, 4 . . . globe (housing), 5 . . . insulating member, 6 . . . cap, 7 . . . substrate, 8, 8a, 8b, 8c . . . LED chip, 9, 9a, 9b, 9c . . . phosphor layer, 10 . . . transparent resin layer, 11, 11a . . . lighting circuit, 12, 12a . . . wiring line.

The invention claimed is:

1. A white light source comprising: a blue light emitting diode having a light emission peak wavelength in a range of 421 to 490 nm; and a phosphor layer including phosphor and resin, wherein the phosphor layer contains three or more types of phosphor selected from among a blue phosphor, a blue-green phosphor, a green phosphor, a yellow phosphor, and a red phosphor, and a mass ratio of the phosphor included in the phosphor layer is 5 mass % or more and 50 mass % or less, wherein the white light source satisfies a relational equation of $-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2$, assuming that: a light emission spectrum of the white light source is $P(\lambda)$; a light emission spectrum of black-body radiation having a same color temperature as that of the white light source is $B(\lambda)$; a spectrum of a spectral luminous efficiency is $V(\lambda)$; a wavelength at which $P(\lambda) \times V(\lambda)$ becomes largest is $\lambda max1$; and a wavelength at which $B(\lambda) \times V(\lambda)$ becomes largest is $\lambda max2$, and wherein an amount of chromaticity change on CIE chromaticity diagram from a time of initial lighting up of the white light source to a time after the white light source is continuously lighted up for 6000 hours is less than 0.010.

2. The white light source according to claim 1, satisfying $-0.1 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.1$.

3. The white light source according claim 1, wherein the color temperature of the white light source is 2,500 to 5,400 K.

4. The white light source according to claim 1, wherein the phosphor layer comprises two or more types of phosphors having different peak wavelengths.

5. The white light source according to claim 1, wherein the three or more types of phosphor each having different peak wavelengths are used in a combination so as to cause a mutual absorption in which one phosphor is excited by absorbing a light emitted from another phosphor.

6. The white light source according to claim 1, wherein the phosphor layer has a thickness of 0.01 to 3 mm.

7. The white light source according to claim 1, wherein the phosphor has an average particle diameter of 1 to 80 μm.

8. The white light source according to claim 1, wherein a space is formed to a portion between the phosphor layer and the light emitting diode.

9. The white light source according to claim 1, wherein the phosphor layer is provided on the light emitting diode.

10. The white light source according to claim 1, wherein the phosphor layer is provided on the light emitting diode through a transparent resin layer.

11. A white light source system comprising a plurality of the white light sources according to claim 1.

* * * * *